United States Patent [19]

Zwicknagl et al.

[11] Patent Number: 4,894,350

[45] Date of Patent: Jan. 16, 1990

[54] METHOD FOR MANUFACTURING OHMIC CONTACTS HAVING LOW TRANSFER RESISTANCES

[75] Inventors: Hans P. Zwicknagl, Stuttgart; Helmut Tews, Unterhaching; Thomas H. Hager, Munich, all of Fed. Rep. of Germany

[73] Assignee: Siemens Aktiengesellschaft, Berlin and Munich, Fed. Rep. of Germany

[21] Appl. No.: 248,114

[22] Filed: Sep. 23, 1988

[30] Foreign Application Priority Data

Sep. 23, 1987 [DE] Fed. Rep. of Germany ....... 3732043

[51] Int. Cl.[4] .................... H01L 29/46; H01L 21/265
[52] U.S. Cl. .................................... 437/184; 437/247; 437/192; 357/71; 148/DIG. 100
[58] Field of Search ............... 437/184, 183, 203, 247, 437/192, 22, 196, 201

[56] References Cited

U.S. PATENT DOCUMENTS

| | | | |
|---|---|---|---|
| 3,769,694 | 11/1973 | Collins et al. | 437/196 |
| 4,470,189 | 9/1984 | Roberts et al. | 437/192 |
| 4,471,005 | 9/1984 | Cheng et al. | 437/196 |
| 4,472,206 | 9/1984 | Hodgson et al. | 437/22 |
| 4,566,021 | 1/1986 | Yokoyama . | |
| 4,570,324 | 2/1986 | Smith et al. . | |
| 4,574,298 | 3/1986 | Yamagishi et al. . | |
| 4,610,730 | 9/1986 | Harrington et al. . | |
| 4,654,960 | 4/1987 | McLevige et al. . | |
| 4,679,305 | 7/1987 | Morizuka . | |
| 4,729,967 | 3/1988 | Armiento | 437/184 |

FOREIGN PATENT DOCUMENTS

| | | |
|---|---|---|
| 0123926 | 11/1984 | European Pat. Off. . |
| 0128385 | 12/1984 | European Pat. Off. . |
| P3726717 | 12/1984 | Fed. Rep. of Germany . |
| 0124276 | 7/1983 | Japan .................... 437/247 |
| 0145158 | 8/1983 | Japan .................... 437/228 |
| 0111325 | 6/1984 | Japan .................... 437/192 |

OTHER PUBLICATIONS

C. L. Chen et al, "Ohmic contacts to n-type GaAs using high-temperature rapid thermal annealing for self-f-aligned processing", Appl. Phys. Lett. 50 (17), Apr. 27, 1987, pp. 1179–1181.

Giampiero Donzelli et al, "Degradation Mechanism of Ti/Au and Ti/Pd/Au Gate Metallizations in GaAs MESFET's", IEEE Transactions on Electron Devices, vol. ED-34, No. 5, May 1987, pp. 957–960.

Suehiro Sugitani et al, "Characterization of a thin Si-implanted and rapid thermal annealed n-GaAs layer", Appl. Phys. Lett. 51 (11), Sep. 14, 1987, pp. 806–808.

B.-K. Liew et al, "Study of Solid-Phase Reactions of Metals on GaAs with a TiN Diffusion Barrier", Solid-State Electronics, vol. 30, No. 6, pp. 571–578, 1987.

Yoko Uchida et al, "Study of Thermal Stability of LaB$_6$ and GaAs Interfaces by High Energy Ion Scattering", Japanese Journal of Applied Physics, vol. 25, No. 9, Sep. 1986, pp. L767–L769.

K. Ishii et al, "High-Temperature Stable W$_5$Si$_3$/In$_{0.53}$Ga$_{0.47}$As Ohmic Contacts to GaAs for Self-Aligned HBTS", Fujitsu Laboratories, Ltd., Atsugi, Japan, IEEE 1986, pp. 274–277.

Sandip Tiwari, "GaAlAs/GaAs Heterostructure Bipolar Transistors: Experiment and Theory", IBM T. J. Watson Research Center, Yorktown Heights, New York, IEEE 1986, pp. 262–265.

M. F. Chang et al, "GaAs/(GaAl)As Heterojunction Bipolar Transistors Using a Self-Aligned Substitutional Emitter Process", IEEE Electron Device Letters, vol. EDL-7, No. 1, Jan. 1986.

Primary Examiner—Brian E. Hearn
Assistant Examiner—Tuan Nguyen
Attorney, Agent, or Firm—Hill, Van Santen, Steadman & Simpson

[57] ABSTRACT

A method for manufacturing ohmic contacts having low transfer resistances on doped semiconductor material, whereby the doping is implanted self-aligning using mask technique and the metallization is applied and, after removal of the mask layer, a temperature-time cycle occurs for simultaneous annealing the doping and alloying in the metallization.

3 Claims, 1 Drawing Sheet

METHOD FOR MANUFACTURING OHMIC CONTACTS HAVING LOW TRANSFER RESISTANCES

BACKGROUND OF THE INVENTION

The present invention is directed to a method for manufacturing ohmic contacts having low transfer resistances on semiconductor material that has been doped or doped.

Typically, in the manufacture of planar hetero bipolar transistors, particularly those based on GaAs, difficulties occur in manufacturing the metallization for the contacting of the active, doped zones, of the transistor with adequately low transfer resistance. In manufacturing npn transistors, n-doped regions in the semiconductor substrate are fashioned for the emitter and for the collector. The base is p-doped by a further implantation. The implants are annealed and activated by heating. The annealing occurs at high temperatures, either based on long-term furnace annealing or rapid thermal annealing in a rapid thermal anneal system.

After the annealing, metal contacts are applied on and alloyed into the doped regions of the transistor. In most known manufacturing processes, the implantations are first annealed at high temperatures, then the metallization is applied, and finally these metal contacts are alloyed in at comparatively low temperatures. Such a process is described in the publication by M.F. Chang et al, "GaAs/(GaAl)As Hetero-Junctin Bipolar Transistors using a Self-Aligned substitutional Emitter Process" in IEEE Electron Device Letters EDL-7, 8 through 10 (1986). In the process a hetero bipolar transistor is manufactured whereby the doping for the base occurs by implantation and the emitter region serves as a masking. In this way, a base region self-aligned to the emitter is produced. The base doping is annealed before the appertaining metallization is applied. The base metallization is adjusted with respect to the doped base region and with respect to the emitter region. This adjustment results through the use of a silicon oxide or silicon nitride mask technique.

Another possible process for the annealing of implants and alloying in of the metallization is described in the publication by K. Ishii et al, "High Temperature Stable $W_5Si_3/In_{0.53}Ga_{0.47}As$ Ohmic Contacts to GaAs for Self-Aligned HBTS" in IEDM 86, pages 274 through 277. The annealing of the doping and the alloying in of the metallization occurs in a one step tempering process. The metallization is first applied and then used as a mask for the implantation of the doping. For the contacts into the appertaining fundamental doping of the semiconductor material a high temperature stable metallization is used. This allows the annealing of the implanted doping and the alloying in of the metallization to occur in one tempering step.

Both of the processes are similar in that the annealing of the implants respectively occurs for regions that are not yet provided with metallizations at the moment of annealing.

SUMMARY OF THE INVENTION

The present invention provides a self-aligning method for manufacturing ohmic contacts having low transfer resistance on semiconductor material wherein the annealing of n-implantations or p-implantations in III-V semiconductor material and the alloying in of the appertaining metallizations occurs in a single temperature-time cycle. The method also achieves a transfer resistances that is not greater than that produced in processes wherein the annealing of the implantation and the alloying in of the contacts are carried out in separate process steps.

To this end, the present invention provides a method for manufacturing ohmic contacts having low transfer resistances on a semiconductor layer of III-V semiconductor material, where the semiconductor layer is first provided with a mask layer and an implantation for producing at least one doped region. The method comprises the following steps: a) applying a metallization, that is resistant to high temperature, onto said semiconductor layer material implanted with said doping implantation; b) removing said mask layer and the portion of the metallization situated thereon; and c) annealing and alloying in said implantation and said metallization simultaneously.

In an embodiment, the method of the present invention further includes the step of using a rapid thermal annealing system for the annealing and alloying in of the implantation and the metallization simultaneously.

In an embodiment, the doping ensues for n-conduction.

In an embodiment, the doping ensues for p-conduction.

In an embodiment, the metallization occurs using a material selected from the group consisting of a metal silicide, a metal nitride, and a metal boride.

In an embodiment, the metal for the metallization is a metal selected from the group consisting of titanium, tungsten, tantalum, molybdenum, zirconium, niobium, and vanadium.

In an embodiment, the metallization is successively applied titanium, platinum, and titanium.

In an embodiment, the metallization is successively applied titanium, platinum, and gold.

In an embodiment, the metallization is successively applied titanium, platinum, gold, titanium, and platinum.

In an embodiment, the semiconductor layer containing the ohmic contact forms an uppermost layer of a layer sequence.

Additional features and advantages of the present invention will be apparent from the detailed description of the presently preferred embodiments and from the drawings.

BRIEF DESCRIPTION OF THE DRAWINGS

The figures illustrate five steps in the process of the present invention.

FIG. 5 illustrates the substrate with the doped region and the metallization applied on this region after the removal of the mask layer and after the tempering process for annealing the implantations and for alloying the metallization in.

DETAILED DESCRIPTION OF THE PRESENTLY PREFERRED EMBODIMENTS

Figure 1:
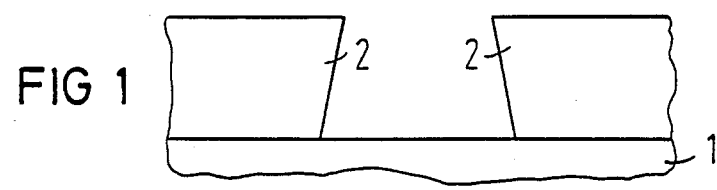
FIG. 1 illustrates the substrate with the applied mask layer.

The present invention provides a self-aligning method for manufacturing ohmic contacts having low transfer resistances on semiconductor material wherein the annealing of n-implantations or p-implantations in III-V semiconductor material and the alloying in of the appertaining metallization occurs in a single temperature-time cycle.

The method of the present invention makes use of the fact that high temperature stable metallizations for III-V semiconductor material exist. Particularly for GaAs substrates, metallizations for n-doping and for p-doping are available and can be applied to the surface of appropriately doped regions and then are alloyed in at temperatures that correspond to the annealing cycle of the n-or p-implants.

The method of the present invention is unique, in part, in that a common annealing and alloying in one step for doped regions and their appertaining metallization is carried out. The standard photo-mask technique can therefore be applied for a region to be subsequently doped as well as for the metallizations to be applied thereto. Thus it is possible to carry out the inventively proposed manufacturing process in a self-aligning fashion.

The metallizations contain one or more metals which are successively applied and are subsequently alloyed in. Several metals can be used for the contacting of regions doped for n-conduction. These are either alloys of the appertaining metal with silicon, nitrogen or boron or stoichiometric compounds of the two elements. Intermetallic alloys and compounds and layers of pure metal can also be used. Metals recited in the literature for the contacting of regions doped for n-conduction include titanium silicide, tungsten silicide, molybdenum silicide, tantalum silicide (U.S. Pat. No. 4,566,021), tungsten nitride, tantalum nitride, molybdenum nitride, titanium nitride, zirconium nitride, niobium nitride, vanadium nitride (U.S. Pat. No. 4,574,298), lanthanum hexaboride (Jpn. J. Appl. Phys. 25 L 767 through L 769 (1986)), and tungsten boride (German Patent Application P 37 26 717).

For regions that are doped for p-conduction, metallizations that contain titanium are preferably used.

The metallizations can have many different constructions.

In an embodiment, first titanium, then platinum and, then titanium are applied and subsequently alloyed in.

In an embodiment, first titanium, then platinum, and then gold are applied and subsequently alloyed in.

In another embodiment, first titanium, then platinum, then gold, then titanium, and finally platinum are applied and subsequently alloyed in.

In a further embodiment, a metallization can also be produced by successive application of germanium, gold, chrome and gold. Using this germanium-gold-chrome-gold alloy, adequately low transfer resistances, at alloying times between only five and seven minutes are obtained on p-doped regions. Much broader temperature-time limits for the manufacture of metallizations having adequately low transfer resistances from p-doped regions occur when using titanium-platinum-gold alloys than occur when using germanium-gold-chrome-gold metallizations. Thus, titanium containing alloys are significantly better suited for the metallization of p-doped regions, especially when using the present method for the manufacture of hetero bipolar transistors.

The method of the present invention will be described in more detail. Referring now to FIG. 1, mask layer 2 is applied to an uppermost semiconductor layer for the manufacture of a component having a substrate of III-V semiconductor material, for example GaAs. The edges of the mask layer 2 that, for example, can be composed of one or more masking layers, and are expediently fashioned in an over-hanging arrangement.

Figure 2:
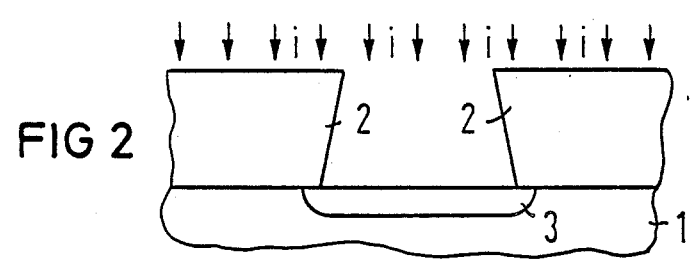
FIG. 2 illustrates the substrate with the mask layer and the implantation of a doped region.
Figure 3:
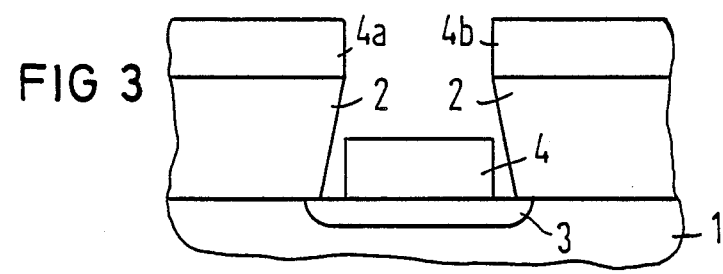
FIG. 3 illustrates the substrate with the mask layer, doped region, and the high temperature resistant metallization deposited.

In the next step, illustrated in FIG. 2, the implantation i for the formation of p-doped or n-doped regions 3 proceeds. The next step involves the deposition of the metallization 4, 4a, 4b in a direction that is illustrated by arrows referenced i in FIG. 2. This results in a metallization 4 on every doped region 3. The metallization is self-aligned with respect to the doped region by using the same mask layer 2. FIG. 3 illustrates the results of depositing the metallization 4, 4a, 4b.

Figure 4:
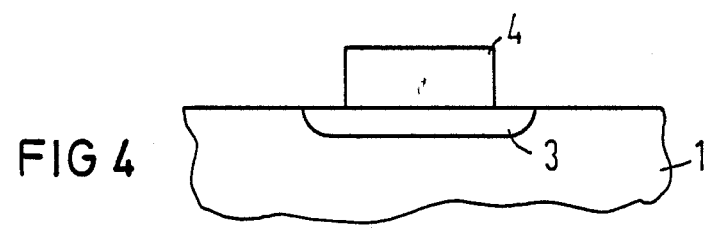
FIG. 4 illustrates the substrate with the doped region and the metallization applied on this region after the removal of the mask layer.

The next step of the method involves using a lift-off technique to remove the mask layer 2 together with the parts of the metallization 4a, 4b situated thereon. As illustrated in FIG. 4, the component is now composed of the substrate which has one or more semiconductor layers whose uppermost semiconductor layer 1 has doped regions 3 having a respective metallization 4.

Finally, the implantations of the doped regions 3 and the metallization 4 situated thereon are simultaneously treated with the same temperature-time cycle. For example, a rapid thermal anneal system can be used to activate the implantations and to alloy the metallization in. In this tempering process, temperature is selected as a function of the time that the transfer resistances of the contacts formed by the alloyed-in metallization 40 do not reach values higher than those defined by the intended use of the device. In the case of a Ti/Pt/Au metallization, or in the case of a Ti/Pt/Ti metallization on a GaAs base, heating to a temperature between 850° C. and 900° C. for a maximum of three seconds, ideally two seconds, supplies transfer resistances that are adequately low for the function of hetero bipolar transistors manufactured in this way.

Figure 5:
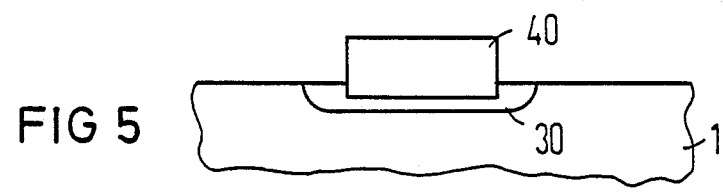

FIG. 5 illustrates the finished component comprising the substrate 1 and the annealed, doped region 30 having alloyed-in metallization 40 situated thereon.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for manufacturing ohmic contacts having low transfer resistances on a semiconductor layer of a III-V semiconductor material, where the semiconductor layer is first provided with a mask layer and an implantation for producing at least one p-doped region, comprising the steps of:

(a) applying a metallization onto said semiconductor layer material implanted with said p-doping implantation, the metallization being chosen from the group consisting of: titanium, platinum, and titanium in this sequence; titanium and platinum and gold in this sequence; in this sequence; and germanium, gold, chrome, and gold in this sequence;

(b) removing said mask layer and a portion of the metallization situated thereon; and
(c) annealing said implantation and alloying in said metallization simultaneously.

2. The method of claim 1 wherein said III-V semiconductor material is GaAs.

3. The method of claim 1 wherein said annealing of said implantation and said alloying in of said metallization is performed by rapid thermal annealing at a temperature of approximately 850° C. to about 900° C. for a maximum of 3 seconds.

* * * * *